(12) United States Patent
Palusinski et al.

(10) Patent No.: US 6,892,367 B2
(45) Date of Patent: May 10, 2005

(54) VERTEX BASED LAYOUT PATTERN (VEP): A METHOD AND APPARATUS FOR DESCRIBING REPETITIVE PATTERNS IN IC MASK LAYOUT

(75) Inventors: Michal Palusinski, Cupertino, CA (US); Mariusz Niewczas, Cupertino, CA (US); Wojciech Maly, Pittsburgh, PA (US); Andrezej Strojwas, Pittsburgh, PA (US); Thomas Waas, Munich (DE); Hans Eisenmann, Munich (DE)

(73) Assignee: PDF Solutions, Inc., San Jose, CA (US)

( * ) Notice: Subject to any disclaimer, the term of this patent is extended or adjusted under 35 U.S.C. 154(b) by 305 days.

(21) Appl. No.: 10/186,372

(22) Filed: Jun. 28, 2002

(65) Prior Publication Data

US 2004/0003357 A1 Jan. 1, 2004

(51) Int. Cl.[7] ............................. G06F 17/50; G06F 9/45
(52) U.S. Cl. ................................ 716/5; 716/8; 716/10
(58) Field of Search ........................................ 716/1–21

(56) References Cited

U.S. PATENT DOCUMENTS 5,613,102 A   3/1997   Chiang et al. ............... 395/500

OTHER PUBLICATIONS

Paper 8.10, "Manufacturability Analysis of 0.25–micron IC Topography Based on Novel Representation Using Repeatability of Layout Patterns", Techcon 1998.

Niewczas et al., "A Pattern Matching Algorithm for Verification and Analysis of Very Large IC Layouts", Proc. of International Symposium of Physical Design, Apr. 1998, Monterey, CA, pp. 129–134.
Niewczas et al., "An Algorithm for Determining Repetitive Patterns in Very Large IC Layouts", IEEE Transactions on Computer–Aided Design of Integrated Circuits and Systems, vol. 18, No. 4, pp. 292–501, Apr. 1999.
Niewczas et al., "Chip Scale 3–D Topography Synthesis", Proc. of 23rd Symposium on Optical Microlithography, SPIE vol. 3334, Feb. 1998.
Niewczas et al., Disclosure of Invention, A Method for Finding Repetitive Patterns in VLSI Mask Layout Data, CMU Technology Transfer Office, no date.
Niewczas et al., "Regularity Extraction from VLSI Mask Layout", Research Report, CMU, Pittsburgh, Jul. 10, 1999, pp. 1–62.
Niewczas et al., "Vicinity Pattern Matching Algorithm for Processing of IC Mask Layouts", SRC Report C99014 (Research Report No. CMUCAD–98–47), Carnegie Mellon University, Dec. 1998.

Primary Examiner—Vuthe Siek
Assistant Examiner—Magid Y. Dimyan
(74) Attorney, Agent, or Firm—Duane Morris LLP; Steven E. Koffs

(57) ABSTRACT

A method to describe a circuit pattern comprises identifying vertices and those edges of the circuit pattern that are not incident with any vertex contained within a region of interest within the circuit pattern. The region of interest includes a portion of a polygon that is less than the entire polygon. The vertices and edges of the circuit pattern are compared to a predetermined set of known vertices and edges. A match may be used to identify an acceptable circuit or a defective circuit.

15 Claims, 7 Drawing Sheets

VERTEX BASED LAYOUT PATTERN (VEP): A METHOD AND APPARATUS FOR DESCRIBING REPETITIVE PATTERNS IN IC MASK LAYOUT

FIELD OF INVENTION

The present invention relates to semiconductor fabrication generally, and more specifically to methods for identifying geometric features in masks and/or circuits.

DESCRIPTION OF THE RELATED ART

In Integrated Circuit (IC) layout verification and analysis applications, it is often desirable to find all the locations on an IC mask (or several masks) in which a particular configuration of geometrical features is present. To give just a few application examples:

(a) in circuit extraction and device modeling, one might be interested in particular configurations of fragments of mask shapes composing a transistor (or a difficult to print pattern of mask edges) of given dimensions.

(b) in optical/process proximity correction (OPC/PPC), one would like to find all occurrences of pre-determined configuration of neighboring edges and vertices, so that the same correction can be applied to all occurrences of such a pattern.

(c) in IC failure analysis, one might for example be interested in all the locations in which a metal1/metal2 via is situated in close proximity to the edge of an active region mask.

A general pattern definition concept and a special isometry invariant signature-based pattern matching method have been developed and published earlier at Carnegie Mellon University. The representation is described in Niewczas, Mariusz, et al., "Chip scale 3-D Topography Synthesis", SPIE Optical Microlithography Conference, in SPIE Optical Microlithography, vol. SPIE 3334, pp 785–794, February 1998, which is incorporated by reference herein in its entirety. Various aspects of a pattern matching algorithm are published in Niewczas, Mariusz, et al., "Vicinity Edge Pattern Matching Algorithm for Processing of IC Mask Layouts", SRC Report C99014 (Research Report No. CMUCAD-98-47), Carnegie Mellon University, December 1998; Niewczas, Mariusz, "Regularity Extraction from VLSI Mask Layout. Basic Considerations on Vertex edge pattern Matching; Prototype Implementation", Research Report, CMU, Pittsburgh, Jul. 10–Oct. 15, 1999 (Revised Oct. 19, 2000, Feb. 12 2001); Niewczas, Mariusz, et al., "An Algorithm for Determining Repetitive Patterns in Very Large IC Layouts", IEEE Trans. on CAD, April 1999, Vol. 18, No. 4, pp. 494–501; and Niewczas, Mariusz, et al., "A Pattern Matching Algorithm for Verification and Analysis of Very Large IC Layouts", IEEE Proc. of Intl. Symposium on Physical Design (ISPD-1998), pp. 129–134, Monterey, April 1998, all of which are incorporated by reference herein in their entireties.

Additional works in the field include Niewczas, Mariusz, et al., "Manufacturability Analysis of 0.25-micron IC Topography Based on Novel Representation Using Repeatability of Layout Patterns", Proc. Of TECHCON '98 Conference, Las Vegas, Nev., September 1998, which is incorporated by reference herein in its entirety. In addition, U.S. Pat. No. 5,613,102, Mar. 18, 1997, is incorporated by reference herein in its entirety. In that patent, layout features and their incremental repetitiveness were used for data compression.

In these documents, the pattern is described as a set of geometrical features (vertex, line segment, chain of vertices, polygon) contained in the layout within a region of interest (ROI). ROI is typically created around a "spanning layout feature". Such feature may be in principle any geometrical feature of a mask layout or a fragment of such feature. (In practical applications, ROI size corresponds to some interaction range. This interaction range may be for example the one used to decompose a big domain into smaller ones in order to carry out a detailed modeling of various physical/chemical phenomena.) The ROI is used to clip out a portion of layout. The shapes contained in this portion are used for pattern definition. The disadvantage of this approach is that, for a given geometrical configuration (such as e.g. an L shaped section of interconnect path), the pattern description is in general dependent upon even small displacements of ROI. This is a problem in prior art solutions since depending upon the choice of ROI, the same geometrical configuration will have different pattern assigned. See for example, the patterns in FIG. 1A. Depending on whether the ROI is located as shown in FIG. 1B or as in FIG. 1C, the same geometrical configuration shown in FIG. 1A yields different patterns due to even a small offset in ROI location.).

An improved pattern representation method is desired.

SUMMARY OF THE INVENTION

The present invention is a method to define a circuit pattern comprising identifying vertices and those edges of the circuit pattern that are not incident with any vertex contained within a ROI within the circuit pattern, without specifying edges that connect the vertices to each other.

BRIEF DESCRIPTION OF FIGURES AND TABLES

Figure 6:
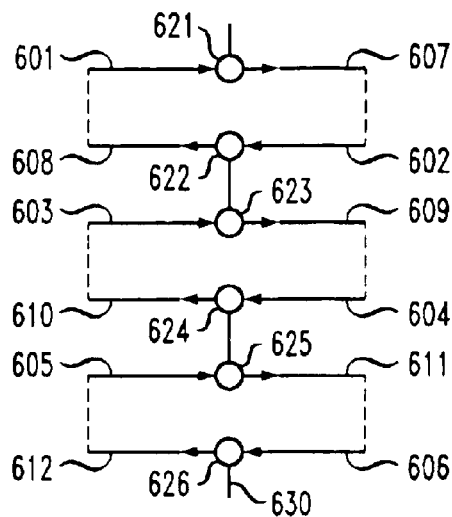

FIG. 6. is a diagram of a pattern for a region with no visible polygonal vertices.

Figure 7:
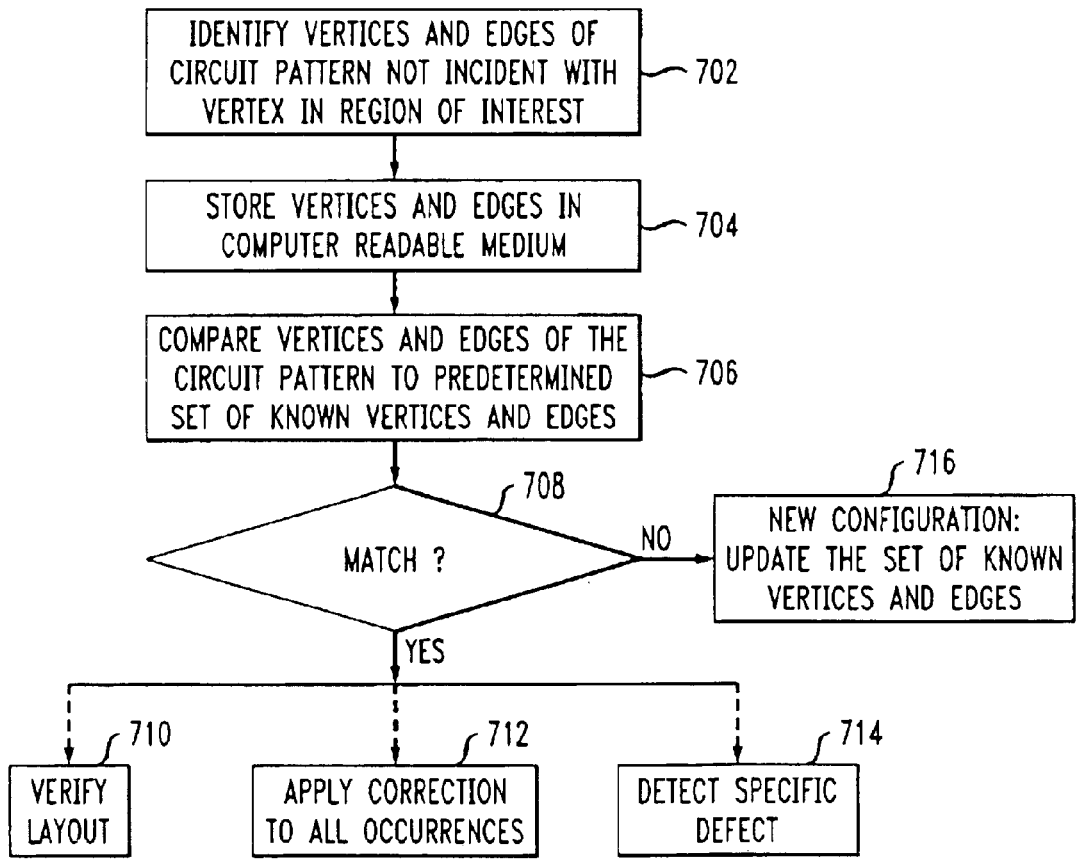

FIG. 7 is a flow chart diagram of a method according to the present invention.

Figure 8:
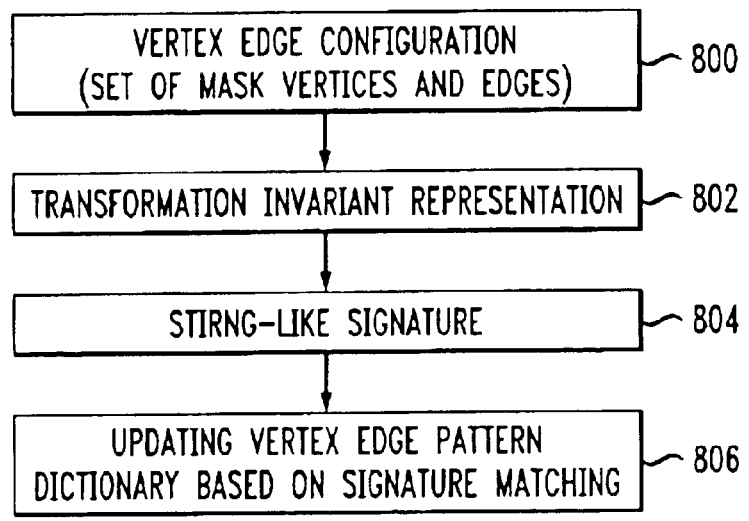

FIG. 8 is a flow chart diagram of an exemplary pattern matching method that may be used for matching vertex edge patterns.

Figure 9A:
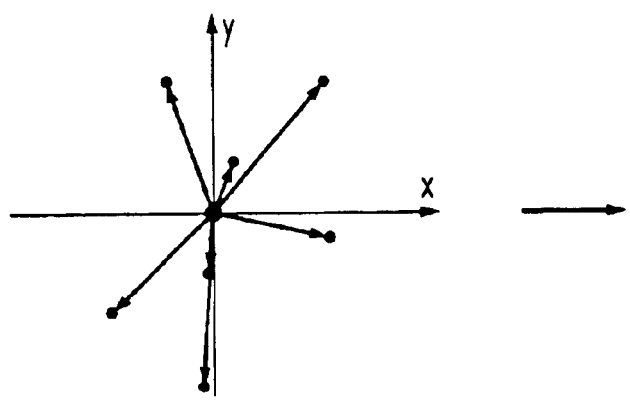
Figure 9B:
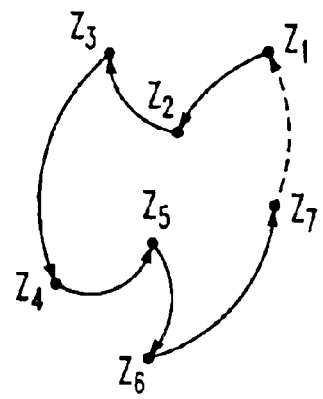

FIG. 9A shows a plurality of vertices in an ROI. FIG. 9B shows the sequencing of the vertices of FIG. 9A.

Figure 10:
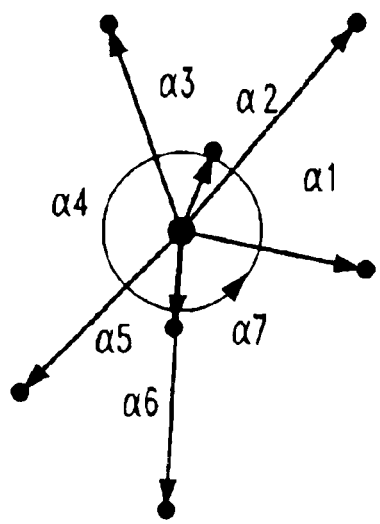

FIG. 10 shows an angle-length sequence for the set of vectors in FIG. 9A.

Figure 11A:
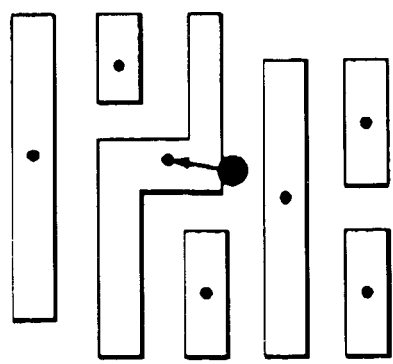
Figure 11B:
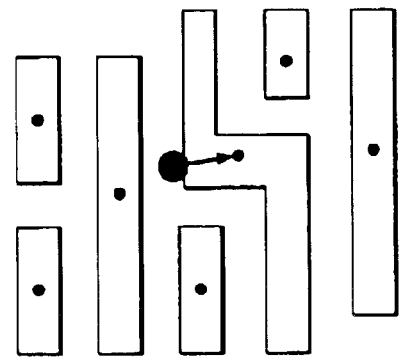

FIGS. 11A and 11B show how position vectors can be transformed into a canonical position.

Figure 12C:
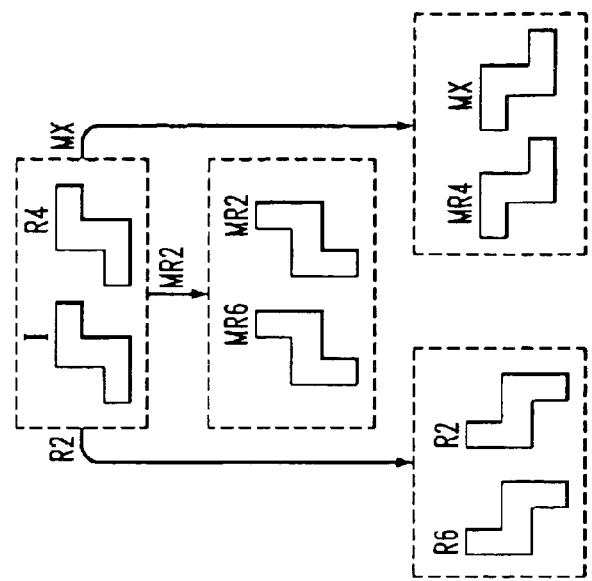
Figure 12B:
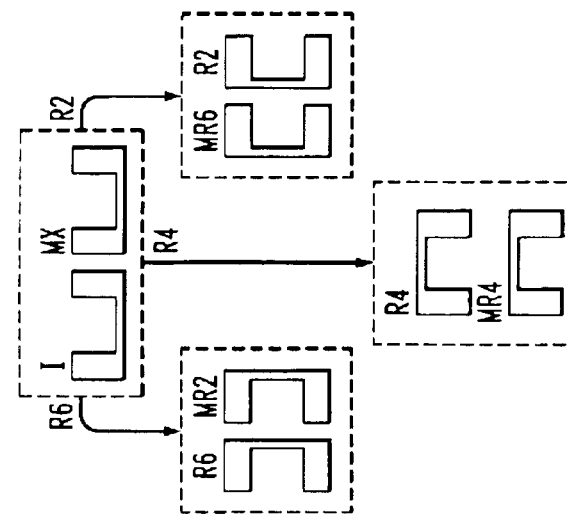
Figure 12A:
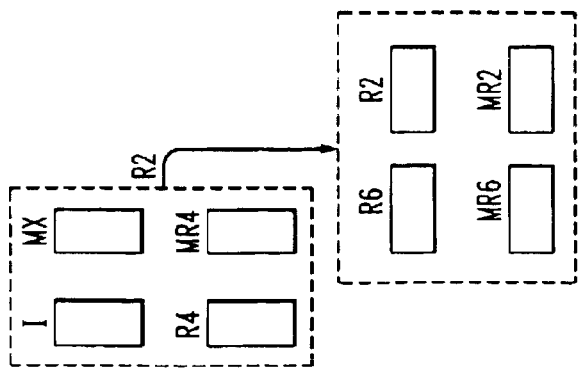

FIGS. 12A–12C show examples of equivalent transformations of pattern instances.

DETAILED DESCRIPTION OF THE INVENTION

Figure 1A:
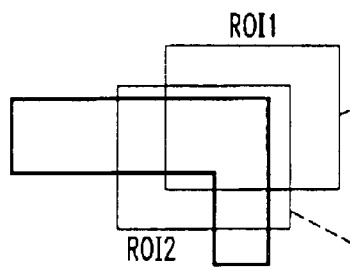
FIGS. 1A–1C show a conventional method of describing a region using contours.
Figure 1B:
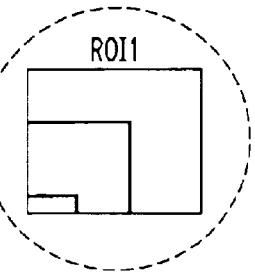
Figure 1C:
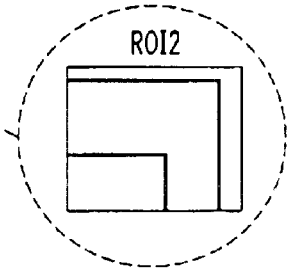
Figure 2A:
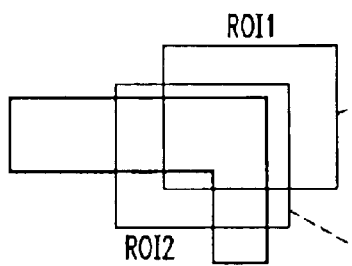
FIGS. 2a–2c show a new method of describing a region using vertices.
Figure 2B:
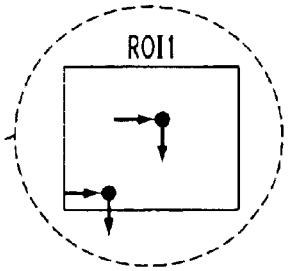
Figure 2C:
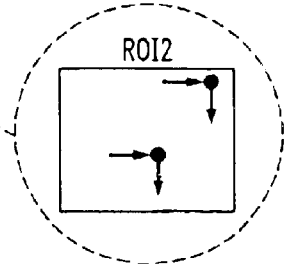

In order to solve a variety of layout verification and analysis problems, one should decide two things: how to define the patterns of interest and what is the pattern matching algorithm to use. In the exemplary embodiments described herein, the pattern components can be limited to two kinds of layout features: vertices and those edges of the circuit pattern that are not incident with any vertex contained within a ROI within the circuit pattern. Moreover, a vertex is treated as in object that carries information about direction of incident edges (but not about the extent of those edges). This method allows one to create a very efficient pattern representation for which the definition of a pattern does not depend upon minor details of centering of the ROI around some layout features (see FIG. 2a, in which the pattern does not change if no new layout features appear while ROI is moved, and compare with FIG. 1A). This is because, in the example described herein, clipping out of the portion of geometrical data does not require creation of additional "artifact" vertices marking the edges of a clipping region. In fact, ROI is no longer needed as a part of pattern definition. It can be assumed that a pattern spans to infinity and only when a pattern instance is considered, some spatial limit, associated with ROI, is imposed. This sort of independence from ROI centering and size allows one to reduce the number of patterns found in a given layout, and also it lets one provide new simple and more general formulation to algorithms such as, e.g., the ones used in applications mentioned above.

The exemplary embodiment disclosed herein is preferably used for two representation that opens way to several more efficient or even entirely new applications.

The pattern representation described herein is preferably used for two dimensional geometrical systems composed of polygons. The exemplary embodiment is able to uniquely describe patterns contained in regions that are typically smaller than the polygons. Hence the basic pattern building blocks can also be smaller than polygon.

The Vertex

Figure 2D:
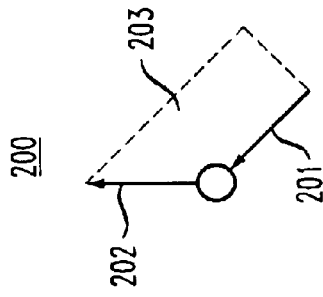
FIG. 2d shows a vertex used to describe a fragment of a region.

The basic building block of the representation is a polygonal vertex 200 (FIG. 2D) with a pair of vectors 201, 202 describing two edges incident with it. In general geometrical terms, the vertex 200 is a point where two edges of an angle intersect. In this particular case, it is also assumed that the edges are ordered so as to preserve information about the location of the interior of the polygon to which the angle belongs. Thus, an in-edge 201 and out-edge 202 are defined for the vertex 200 (see FIG. 2D) and then, the vertex concept is enhanced with the information about the direction of the incident edges. In FIG. 2D, the vertex 200 is used to describe a fragment of an edge of a region 203. Note that the information about the length of these edges 201, 202 is not relevant to defining the vertex 200—the direction is sufficient without the length.

The term "trivial vertex" is used herein to describe a vertex for which the in-edge (e.g., 601–606 in FIG. 6) is collinear with the out-edge (607–612 in FIG. 6). (A plurality of trivial vertices 621–626 are shown in FIG. 6.) The term "polygon vertex" is used herein to describe a vertex for which the in-edge is not collinear with the out-edge. FIGS. 5A–5F show a variety of polygon vertices.

Vertex Based Layout Description

The example described herein is based on the observation that any polygon can be uniquely described by the set of all its polygon vertices. Note that this observation would not be true for just points representing location of polygon vertices (without angle information associated with them), in which case, a sequence—not just the set of points—would be used. In general, different sequences of the same points may define different polygons.

The Pattern Description

Any geometrical pattern contained in a given region of an IC layout can be described as a set of: (1) all the polygon vertices within the region and (2) all the edges that are not incident with any polygon vertex within the region.

Figure 3B:
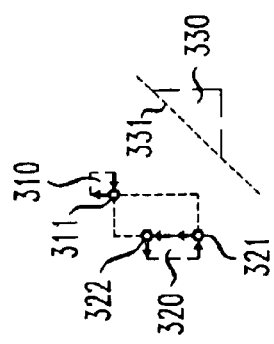
Figure 3A:
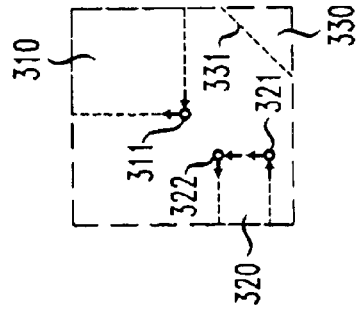
Figure 4B:
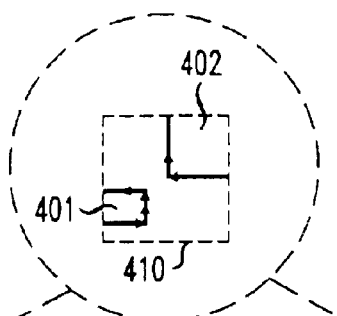
FIGS. 4A–4D show how the same vertex edge pattern is created for two different ROIs.
Figure 4A:
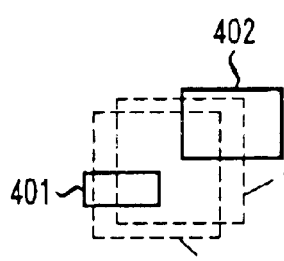
Figure 4D:
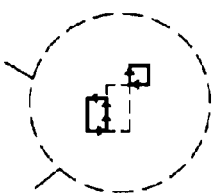
Figure 4C:
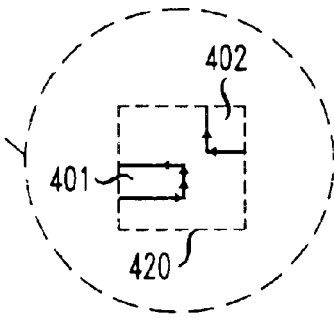
Figure 5A:
FIGS. 5A–5B show vertex types for layouts composed of Manhattan shapes.
Figure 5B:
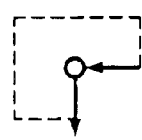
Figure 5C:
FIGS. 5C–5F show vertex types for layouts including additional types for diagonal shapes.
Figure 5D:
Figure 5E:
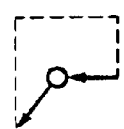
Figure 5F:
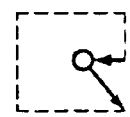

Examples. FIG. 3A illustrates this definition for the case having polygon vertices 311, 321 and 322 and an edge 331 that is not incident with any of the vertices in the region. FIG. 3B shows the vertices 311, 321 and 322 and edge 331 of FIG. 3A. On the other hand, if no polygon vertex is present in a given region (e.g. FIG. 6), the entire pattern would just describe the location of edges with respect to each other. FIGS. 4A–4D show another set of features for which two different patterns are observed in FIGS. 4B and 4C, corresponding to respectively different positioning of the ROI with respect to the patterns being observed. FIG. 4D shows that the ROIs of FIGS. 4B and 4C provide the same vertex/edge information.

EXAMPLE

For polygons with arbitrary angles, more memory is used to specify a polygonal vertex than is used to represent vertex points, since the in-edge and out-edge directions have to be stored. However, for typical IC layouts the set of different kinds of vertices is very small (See, for example, FIGS. 5A–5B, (Manhattan geometry, where one of two possible angles can be represented by just one bit) which contain right angle vertices, and FIGS. 5C–5F, which contain acute and obtuse angle vertices with angles that are multiples of 45 degree, where 3 bits can be used to represent 6 possible angles) and the vertex based layout description representation can have a very small cost overhead.

Figure 3C:
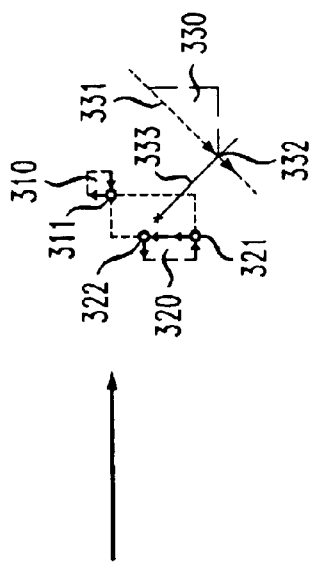
FIGS. 3A–3C show a pattern that contains polygon vertices and an edge.

In an exemplary implementation, it was assumed that in general, any edge within a given region that is not incident with any polygon vertex in this region, can be conveniently described by introduction of exactly one trivial vertex on that edge (e.g. trivial vertex 332 in FIG. 3C and vertices 621–626 in FIG. 6). (Alternatively, instead of trivial vertices, one could just use a sequence of numbers denoting the point locations along given axis like in Niewczas, Mariusz, Maly, Wojciech and Strojwas, Andrzej "Vicinity Pattern Matching Algorithm for Processing of IC Mask Layouts". SRC Report C99014 (Research Report No. CMUCAD-98-47), Carnegie Mellon University, December 1998.). Each such trivial vertex 621–626 (FIG. 6) is positioned on a line 630 normal to the edge so that the vertices describing parallel edges are located on the same line. That line 630 is called the "skeleton line" and is chosen in such a way that it passes through the center of gravity of the set of all the polygon vertices contained within the pattern. If there are no polygon vertices, and there is more than one skeleton line (not shown)—there will be more than one skeleton line within a pattern if the edges that have to be described are not parallel—all skeleton lines are chosen in such a way that they intersect in one point. This way a unique pattern signature can be created that is suited for the pattern matching algorithm.

This representation is used in the pattern matching procedures of the layout processing software. A pattern matching method described below is applicable. Thus, the exemplary embodiment of the invention described herein is practically useful allowing for isometry invariant pattern description.

A vertex based representation of a type for which an example is presented herein has an advantage of independence from small changes in centering and size of a region of interest through which a pattern instance is seen. By "small changes" it is understood that the changes do not introduce (remove) neither any vertices nor edges into (from) the region. In integrated circuit pattern applications, this is a clear advantage over other geometrical pattern formulations. This representation allows a consistent way to uniquely describe the circuit patterns while abstracting from the iteration scheme by which these patterns were obtained.

This representation can possibly be used with some other pattern matching algorithms (such as some based on neural networks) and could also be adapted to any sets of figures that can be spanned on polygons, such as, e.g., Bezier curves.

One of ordinary skill in the art can readily program the pattern matching algorithms in computer software in any of a variety of languages, suitable for running on a variety of different computer platforms. FIG. 7 is a flow chart diagram of an exemplary program and method.

At step 702, vertices and those edges of the circuit pattern that are not incident with any vertex contained within a region of interest within the circuit pattern are identified. At step 704, after identifying the vertices and edges of the circuit pattern, the vertex and edge data can be stored in a computer readable medium. At step 706, the vertices and edges of the circuit pattern can then be compared to a predetermined set of known vertices and edges, for any of a variety of purposes. For example, if a match is detected at step 708, then in step 710, the results of the comparison may be used for layout based verification. The presence of features in a circuit pattern that match the predetermined set of known vertices and edges can be used as an indicator of an acceptable circuit. Alternatively, at step 712, the results of the comparison can be used for applying a correction to the circuit pattern wherever the comparison shows that the vertices and edges of the circuit pattern match the predetermined set of known vertices and edges. This is a simple tool for applying the correction to all occurrences of a given feature. At step 714, still another alternative use is for detecting a defect if the comparison shows that the vertices and edges of the circuit pattern match the predetermined set of known vertices and edges. For example, a defect may be identified wherever a metal 1/metal 2 via is situated in close vicinity of the edge of an active region mask. Also, if there is no match detected at step 708, then at step 716, a new configuration is characterized and added to the predetermined set of known vertices and edges.

One of ordinary skill in the art can readily determine additional applications for the vertex based pattern method of describing a layout.

Pattern Matching

This section describes how to check two vertex-edge pattern instances for equivalence. This is a primitive operation used for building dictionary of vertex edge patterns FIG. 8 is a diagram showing processing of a vertex edge configuration during pattern dictionary building. At step 800, the vertex edge configuration (set of mask vertices and edges) is identified. At step 802, a transformation is performed into an invariant representation. At step 804, this representation is encoded to a string-like signature. At step 806, the vertex edge pattern dictionary is updated based on signature matching.

In order to uniquely identify a vertex edge pattern equivalence class, the signature is a sequence of the following possible components: edges and vertices. This allows a quick dictionary lookup to be performed since most of non-matching patterns can be eliminated very quickly. First the signature creation procedure is described. Then a comparison of two signatures is described.

The Signature

The signature is created in four steps with the goal of ordering the sequence of vertex edge pattern components in an isometry invariant way and finding the smallest element. This smallest element is referred to as the smallest vertex. It is used as a reference for establishing a transformation allowing one to obtain a vertex edge pattern instance from a vertex edge pattern library entry. The four steps leading to signature creation are described in the following subsections. They can be summarized as follows:

1. Create a local system of coordinates for the given group of vertex edge pattern components and describe location of each component by a position vector in this system of coordinates.

2. Create a position vector sequence in such a way that the arrangement of elements is independent of rotation of local system of coordinates.

3. Find the smallest vertex (rotation/reflection invariant) in the position vector sequence.

4. Transform the sequence and the corresponding vertex edge pattern components to a canonical position.

Each of these steps is described in detail below.

1. Determination of Local System of Coordinates.

The starting point for building the signature is a set of the vertex edge pattern components obtained as an intersection of a given rectangular shadow with the shapes in the layout database. The position of each component is given by coordinates of the geometrical center of its bounding box (ROI). As the first step, a local system of coordinates is created. The origin of this system is located in the center of gravity (COG) of geometrical centers of bounding boxes of all components of a given vertex edge pattern. The COG allows for an efficient, rotation/reflection invariant description of locations of the components with respect to each other. Each vertex edge pattern component is treated as a pattern instance and a position vector is associated with each component.

2. Construction of Position Vector Sequence

The vertex edge pattern signature is based on the collection of the position vectors created during the first step. However, to facilitate reflection/rotation invariant signature comparison, a unique string must be built in a way which is isometry invariant. In other words, no matter how the vertex edge pattern instance is originally situated, the way position vectors follow one another should be the same. In the second step, the set of position vectors is ordered by angle. All n position vectors of the given vertex edge pattern instance are treated as complex numbers z in the just defined local system of coordinates. The angular order is defined as follows. The smallest number is 0. For any $z_j \neq 0$ and $z_k \neq 0$: $z_j < z_k <=> $(arg $(z_j)<$arg $(z_k)$ or (arg$(z_j)=$arg $(z_k)$ and $|z_j|<|z_k|$). It may happen that after angular order some $z_j=z_k$. In such a case the pattern signatures of instances associated with $z_j$ and $z_k$ are compared. In practice, it is enough to compare unique database identifiers of these patterns. Note that on a single layer, in case of canonical form of the layout database, patterns associated with vectors $z_j$ and $z_k$ are different if $z_j=z_k$.

As a result of angular ordering, a position vector sequence is obtained, possibly starting with some zero length vectors. A zero length vector describes a pattern instance which happens to have the geometrical center of the bounding box (ROI) in the COG of the vertex edge pattern instance. In the special case when an entire sequence is composed of zero length vectors only, the first position vector is assumed to represent the smallest vertex and step four, described below, is carried out. Otherwise, in order to locate smallest vertex, a circular list is built from the ordered sequence of all the non-zero vectors by connecting the last element of the sequence with the first one. For example, the sequence of vectors in FIG. 9A is ordered to form the ordered sequence of vectors shown in FIG. 9B. Thus, step 2 in vertex edge pattern signature creation includes applying angular ordering to position vectors treated as complex numbers.

Let $k \leq n$ be the number of non-zero position vectors in a given vertex edge pattern instance. This circular list will be denoted as:

$$S=\{z_i : i=0, \ldots, k-1\} \quad (1)$$

The cycle of vectors on this list remains the same if a vertex edge pattern instance is rotated by any angle before the first step of the algorithm (above) is performed. If the instance were mirrored however, the sequence on the circular list would be reversed with respect to the one just obtained. Note that the coordinates of the vectors change with rotation or reflection. What is invariant is their cycle in which the vectors appear on the list.

At this stage, if there is exactly one shortest non-zero vector, it is assumed to represent the smallest vertex and the fourth step, described below, is carried out; otherwise, if there is exactly one longest non-zero vector, it is assumed to represent the smallest vertex and the fourth step is carried out. Otherwise, if neither of these conditions is met, the third step is performed.

3. Finding the Smallest Vertex

The circular list S of non-zero position vectors is converted into an auxiliary structure which is referred to as a relative position sequence Sr. The purpose of this structure is to find the smallest vertex in a way which is independent from rotation of the local coordinate system. $S_r$ is an angle-length sequence (FIG. 10) in which each angle is the angle between two subsequent position vectors. Namely, the i-th angle is found as the argument of the result of division of $z_i$ by its predecessor $z_{(i-1) mod\ k}$ (modulo k indexing accounts for the fact that the "last" element is followed by the "first").:

$$S_r=\{(\angle_1, 1_i):0, \ldots, k-1\}= \{(\arg(z_i/z_{(i-1) mod\ k}), |z_i|):1=0, \ldots, k-1\} \quad (2)$$

In FIG. 10, the relative angle-length sequence is represented for $\angle_1$-length1-$\angle_2$-length2-$\angle_3$-length3-$\angle_4$-length4-$\angle_5$-length5-$\angle_6$-length6-$\angle_7$-length7 for finding the smallest position vector. Using $S_r$, which is an angle-length sequence, the smallest vertex is found. The signature is based on the angle-length sequence. Such a sequence is rotation invariant, but is inverted if the chain is mirrored. To create a signature, the lexicographically smaller of the two possible angle-length sequences of the chain are chosen. The sequence that agrees with the chain orientation is called the "direct sequence," whereas the sequence that does not agree with the chain orientation is called the "indirect sequence." Note that reflection of S causes negation of the angle between two subsequent vectors on the circular list and this has to be taken into account when an "indirect sequence" is compared against a "direct one."

4. Transformation of Position Vector Sequence to Canonical Position

In order to complete the signature, the position vector sequence is transformed from the initial position (FIG. 11A) to a canonical position (FIG. 11B). A determination is made as to which of the eight possible transformations (mirror/rotate with respect to COG) is to be performed. This is done with the use of the smallest vertex. In FIG. 9A, the position vector of the smallest vertex is shown. The inverted angle-length sequence starting at $z_5$ (FIG. 9B) is the smallest one. Hence, the instance to pattern transformation requires mirroring.

If the smallest vertex is represented by a zero length vector, the transformation code is deduced from the transformation code of the pattern instance associated with it. If the smallest vertex represents a non-zero position vector a convention is assumed, that the vector should be located in the first quadrant after the transformation. Moreover, the transformation includes reflection, if the smallest position vector sequence found in the third or the second step of the algorithm was "indirect." The transformation is performed in such a way that not only [x,y] coordinates of position vectors are changed but also the transformation codes of pattern instances associated with the position vectors are changed accordingly.

Comparison of Vertex Edge Pattern Signatures

Comparison of two vertex edge pattern signatures is done in two stages.

1. The position vector sequences of both signatures are compared. This is done by pairwise comparison of vector coordinates in both sequences. This is possible since the sequences were preprocessed by transformation to a canonical orientation in the final step of signature creation described above with reference to FIG. 11B.

2. If the vector sequences are equal, the pattern instances (representing vertex edge pattern components) associated with the corresponding position vectors in both sequences are checked for equivalence. Each such pattern instance is represented by: a reference to the pattern it instantiates, coordinates of the geometrical center of its bounding box (called the origin) and a pattern to instance transformation code.

In the context of vertex edge pattern signature comparison, the pattern instances (the vertex edge pattern components) are equivalent if and only if: (1) they have the same position with respect to the COG, (2) they are instances of the same pattern, and (3) they have the same transformation code. The first property is already checked by the position vector comparison. The second property can easily be verified by comparison of unique pattern database ID numbers of both instances. The third property simply relies on comparison of transformation codes.

However, due to internal symmetry of some patterns, it is possible that not all 8 transformation codes mean a unique position of the pattern instance.

FIGS. 12A–12C show examples of equivalent transformations of pattern instances due to internal symmetry of a pattern: FIG. 12A is a figure with central and axial symmetry, FIG. 12B is a figure with axial symmetry, and FIG. 12C is a figure with two-fold central symmetry. The meanings of the transformation codes are: I—identity, MX—mirror with respect to Y axis, Ri—counter-clockwise rotation of the figure by i*45°, MRi—application of MX to the result of $R_i$.

For example, in FIG. 12A, an instance of a rectangle is equivalent to the same instance rotated by 180° around its geometrical center. Without accounting for the internal pattern symmetry, the comparison of transformation codes of such two instances would yield a false result because the codes are different. In order to address this issue, 9 transformation equivalence classes are considered, and each pattern is assigned to one of them. Hence, only a subset of all transformation codes is used to describe instances of a given pattern if the pattern has internal symmetry. For example (for the transformation symbols see FIGS. 12A–12C): only two different codes, I and R2, are used for instances of a rectangle (FIG. 12a); four different codes, I, R2, R4, R6, are used for instances of a U-shaped contour (FIG. 12b); another set of four codes, I, MX, R2, MR2, is used for the contour shown on FIG. 12c.

Classification to a given equivalence class can be easily done by analysis of the pattern signature; namely, by checking the number of smallest vertices and by comparison of direct and indirect sequences. The transformation equivalence classes are subgroups of the group of all allowable transformations. Geometrical considerations leading to definition of these subgroups are very basic and are omitted here for the sake of brevity.

Multilayer Patterns

A multilayer vertex edge pattern instance is treated as a set of single layer vertex edge pattern instances generated with the same rectangular shadow. Depending upon the application, the shadow may be spanned either on a set of basic layout features belonging to exactly one mask or belonging to several masks. For example, a multilayer vertex edge pattern instance can be created by clipping a set of three masks: metal 1, via and metal 2 with a rectangular shadow spanned on a set of vertices from the metal 2 mask.

A multilayer vertex edge pattern can be represented as an ordered set of respective single layer vertex edge patterns (discussed above). Ordering within this set is done by the mask number. With such a representation, multilayer vertex edge pattern matching is performed on a layer by layer basis: two multilayer patterns are equivalent if they are composed of the same layers and all their respective single layer vertex edge pattern instances are equivalent.

The present invention may be embodied in the form of computer-implemented processes and apparatus for practicing those processes. The present invention may also be embodied in the form of computer program code embodied in tangible media, such as floppy diskettes, random access memory (RAM), read only memories (ROMs), CD-ROMs, hard disks, high density (e.g., "ZIP™" or "JAZZ™") removable disks, DVD-ROMs, or any other computer-readable storage medium, wherein, when the computer program code is loaded into and executed by a computer, the computer becomes an apparatus for practicing the invention. The present invention may also be embodied in the form of computer program code, for example, whether stored in a storage medium, loaded into and/or executed by a computer, or transmitted over some transmission medium, such as over the electrical wiring or cabling, through fiber optics, or via electromagnetic radiation, wherein, when the computer program code is loaded into and executed by a computer, the computer becomes an apparatus for practicing the invention. When implemented on a general-purpose processor, the computer program code segments configure the processor to create specific logic circuits.

Although the invention is described herein in terms of exemplary embodiments, it is not limited thereto. Rather, the appended claim should be construed broadly, to include other variants and embodiments of the invention, which may be made by those skilled in the art without departing from the scope and range of equivalents of the invention.

What is claimed is:

1. A method to define a circuit pattern having a plurality of vertices and a plurality of edges, the edges connecting the plurality of vertices in the circuit pattern, the method comprising:

identifying vertices within a region of the circuit pattern without explicitly specifying edges that connect the identified vertices to each other; and identifying a subset of the plurality of edges of the circuit pattern that are within the region and are not incident with any vertex within the region.

2. The method of claim 1, wherein the region includes a portion of a polygon that is less than the entire polygon.

3. The method of claim 1, wherein the region includes a plurality of portions of respective polygons, each portion being less than the entire respective polygon.

4. The method of claim 1, further comprising comparing the identified vertices and identified edges of the circuit pattern to a predetermined set of known vertices and edges.

5. The method of claim 4, further comprising verifying a layout of the circuit pattern based on the comparison.

6. The method of claim 4, further comprising applying a correction to the circuit pattern if the comparison shows that the identified vertices and the identified edges match the predetermined set of known vertices and edges.

7. The method of claim 4, further comprising detecting a defect if the comparison shows that the identified vertices and the identified edges match the predetermined set of known vertices and edges.

8. A computer readable medium having computer program code encoded thereon, wherein, when the computer program code is executed by a processor, the processor executes a method for defining a circuit pattern having a plurality of vertices and a plurality of edges, the plurality of edges connecting the plurality of vertices in the circuit pattern, the method comprising:

identifying vertices within a region of the circuit pattern without explicitly specifying edges that connect the identified vertices to each other; and identifying a subset of the plurality of edges of the circuit pattern that are within the region and are not incident with any vertex contained within the region.

9. The medium of claim 8, wherein the method further comprises comparing the identified vertices and identified edges of the circuit pattern to a predetermined set of known vertices and edges.

10. The medium of claim 9, wherein the method further comprises verifying a layout of the circuit pattern based on the comparison.

11. The method of claim 9, wherein the method further comprises applying a correction to the circuit pattern if the comparison shows that the identified vertices and the identified edges match the predetermined set of known vertices and edges.

12. The method of claim 9, wherein the method further comprises detecting a defect if the comparison shows that the identified vertices and the identified edges of the circuit pattern match the predetermined set of known vertices and edges.

13. A system for defining a circuit pattern having a plurality of vertices and a plurality of edges, the edges connecting the plurality of vertices in the circuit pattern, the system comprising:

means for identifying vertices within a region of the circuit pattern without explicitly specifying edges that connect the identified vertices to each other;

means for identifying a subset of the plurality of edges of the circuit pattern that are within the region and are not incident with any vertex contained within the region; and a storage device in which data representing the identified vertices and identified edges are stored.

14. The system of claim 13, further comprising means for comparing the identified vertices and identified edges of the circuit pattern to a predetermined set of known vertices and edges.

15. The system of claim 14, further comprising means for verifying the circuit pattern if the comparison shows that the identified vertices and identified edges of the circuit pattern match the predetermined set of known vertices and edges.

* * * * *